(12) United States Patent
Rees

(10) Patent No.: US 6,515,505 B1
(45) Date of Patent: *Feb. 4, 2003

(54) FUNCTIONALITY CHANGE BY BOND OPTIONING DECODING

(75) Inventor: David Brian Rees, Overton (GB)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/902,206

(22) Filed: Jul. 29, 1997

Related U.S. Application Data

(63) Continuation of application No. 08/579,853, filed on Dec. 26, 1995.

(51) Int. Cl.$^7$ ............................................. H03K 19/177
(52) U.S. Cl. .............................. 326/38; 326/39; 326/16; 326/105
(58) Field of Search ............................... 326/37–39, 16, 326/105

(56) References Cited

U.S. PATENT DOCUMENTS

| | | | | |
|---|---|---|---|---|
| 4,896,060 A | * | 1/1990 | Ma | 326/38 |
| 4,902,917 A | * | 2/1990 | Simpson | 326/38 |
| 5,084,635 A | * | 1/1992 | Toda et al. | 326/105 |
| 5,161,124 A | * | 11/1992 | Love | 365/222 |
| 5,353,250 A | * | 10/1994 | McAdams | 365/189.03 |
| 5,402,018 A | * | 3/1995 | Koyanagi | 326/105 |

OTHER PUBLICATIONS

Mano, *Computer Engineering: Hardware Design.* Prentice Hall: Englewood Cliffs, NJ. pp. 96–99, 1988.*

* cited by examiner

*Primary Examiner*—Michael Tokar
*Assistant Examiner*—Vibol Tan
(74) *Attorney, Agent, or Firm*—Christopher P. Maiorana, P.C.

(57) ABSTRACT

A method and apparatus for functionality change in an integrated circuit chip includes bonding pads by which the functionality of the chip may be selected. Bonding pads are connected to a decoder which determines which path of a predetermined number of paths is to be chosen to provide the selected function. Control signals are fed to logic circuits in predetermined portions of the remainder of the integrated circuit chip to control functions of sub-circuits within the various portions of the integrated circuit chip.

9 Claims, 2 Drawing Sheets

| | |
|---|---|
| CY74FCT16240T | 16-BIT BUFFER/LINE DRIVER |
| CY74FCT162240T | 16-BIT BUFFER/LINE DRIVER |
| CY74FCT16244T | 16-BIT BUFFER/LINE DRIVER |
| CY74FCT162244T | 16-BIT BUFFER/LINE DRIVER |
| CY74FCT16444T | 16-BIT BUFFER/LINE DRIVER |
| CY74FCT162H244T | 16-BIT BUFFER/LINE DRIVER |
| CY74FCT16245T | 16-BIT TRANSCEIVER |
| CY74FCT162245T | 16-BIT TRANSCEIVER |
| CY74FCT16445T | 16-BIT TRANSCEIVER |
| CY74FCT162H245T | 16-BIT TRANSCEIVER |
| CY74FCT16373T | 16-BIT LATCH |
| CY74FCT162373T | 16-BIT LATCH |
| CY74FCT16374T | 16-BIT REGISTER |
| CY74FCT162374T | 16-BIT REGISTER |
| CY74FCT16500T | 18-BIT REGISTERED TRANSCEIVER |
| CY74FCT162500T | 18-BIT REGISTERED TRANSCEIVER |
| CY74FCT16501T | 18-BIT REGISTERED TRANSCEIVER |
| CY74FCT162501T | 18-BIT REGISTERED TRANSCEIVER |
| CY74FCT162H501T | 18-BIT REGISTERED TRANSCEIVER |
| CY74FCT16543T | 16-BIT LATCHED TRANSCEIVER |
| CY74FCT162543T | 16-BIT LATCHED TRANSCEIVER |
| CY74FCT16646T | 16-BIT REGISTERED TRANSCEIVER |
| CY74FCT162646T | 16-BIT REGISTERED TRANSCEIVER |
| CY74FCT16652T | 16-BIT REGISTERED TRANSCEIVER |
| CY74FCT162652T | 16-BIT REGISTERED TRANSCEIVER |
| CY74FCT16823T | 18-BIT REGISTER |
| CY74FCT162823T | 18-BIT REGISTER |
| CY74FCT16827T | 20-BIT BUFFER |
| CY74FCT162827T | 20-BIT BUFFER |
| CY74FCT16841T | 20-BIT LATCH |
| CY74FCT162841T | 20-BIT LATCH |
| CY74FCT16952T | 16-BIT REGISTERED TRANSCEIVER |
| CY74FCT162952T | 16-BIT REGISTERED TRANSCEIVER |
| CY74FCT162H952T | 16-BIT REGISTERED TRANSCEIVER |

FIG. 3

FUNCTIONALITY CHANGE BY BOND OPTIONING DECODING

This is a continuation of U.S. patent application Ser. No. 08/579,853, filed Dec. 26, 1995.

BACKGROUND OF THE INVENTION

1. Field of the Invention

The present invention pertains to circuit functionality changes and more particularly to changing the function of integrated circuit chips by changing interconnections.

2. Related Prior Art

Presently in the prior art, there are several methods for modifying the function of an integrated circuit chip. For example, various circuits may be separated by burning through laser or chemical means. By this method portions of an integrated circuit may be isolated similar to the manner in which bad memory cells may be isolated in a DRAM. However, the prior art methods must take place prior to the sealing of the chip in its casing.

In present integrated circuit chips, there are pads that may be connected to bond wires that electrically connect the chip to the package or substrate on which the chip is mounted. A pad on an integrated circuit chip may or may not have a bond wire connecting the pad to VCC or ground or any other electrical signal when the integrated circuit chip is placed in the package.

FIG. 1 is an illustration of the possible connection of a pad to an external signal. Pad 12 is illustrated as having a bond wire 14 connected to ground. Pad 12 is connected internally to an input buffer illustrated as inverter 16 through wire 18. Wire 18 is also connected to Vcc at node 20 through resistor 22.

The circuitry connected to pad 12 is normally biased in the opposite voltage to that which bond wire 14 may connect it to. That is, the input circuitry connected to pad 12 may see pad 12 as connected to ground if bond wire 14 is used, otherwise the circuitry will see the pad as connected to $V_{CC}$ at node 20. Many devices use this sort of technique.

This technique, although used for this purpose also has potential to provide additional benefits that can result in less required inventory and fewer manufacturing lines. In the prior art, the technique has been used to select between two modes. For example, between the normal operating mode of the chip and a special mode which could be used for testing. Alternatively, it has been used to select between two different operating modes of a chip with slightly different functionality. For example, the chip may have a chip enable mode which turns off the outputs but can also be selected to power down the internal logic.

SUMMARY OF THE INVENTION

The present invention provides a method and apparatus for selecting the functionality or changing the functionality from many different alternatives in an integrated circuit chip. This method includes bonding pads by which the particular functionality of the chip may be selected by bonding out particular pads or not bonding out particular pads. These bonding pads are connected to a decoder circuit located on the integrated circuit chip itself The decoder circuit determines, depending on which of the bonding pads have been bonded out, which path of a predetermined number of paths is to be chosen to provide the selected function. In the preferred embodiment there are four bond pads. From these four bond pads, sixteen possible combinations are possible. The decoder circuit determines which of these sixteen possible options has been selected and feeds this information to a circuit which generates control signals in response to the selected option. The control signals are fed to logic circuits in predetermined portions of the remainder of the integrated circuit chip. The logic circuits control functions of sub-circuits within the various portions of the integrated circuit chip. By determining the function of the sub-circuits, the overall functionality of the integrated circuit chip is dictated.

BRIEF DESCRIPTION OF THE DRAWINGS

FIG. 3 is a complete list of parts of the 7144 integrated circuit chip.

DESCRIPTION OF THE PREFERRED EMBODIMENT

The ability to change functions may be implemented by decoding circuits on the integrated circuit chip itself In practicing the present invention, an integrated circuit chip, the 7144, was chosen. In this chip, the decoding is done in two levels, although it could be done in any number of levels. The first level decodes the signals on the four bond option pads into effectively sixteen different signal wires. Each of these sixteen wires represents one of the possible sixteen functional options. Of these sixteen possible wires, one required wire is active.

The second level decodes the sixteen signal wires into a complex set of control wires which are routed around the chip and control the various internal functions listed and defined above.

The present invention provides a method and apparatus that permits the use of one or more bond option pads to decode a set of control wires which will completely change the function on the chip.

Figure 1:
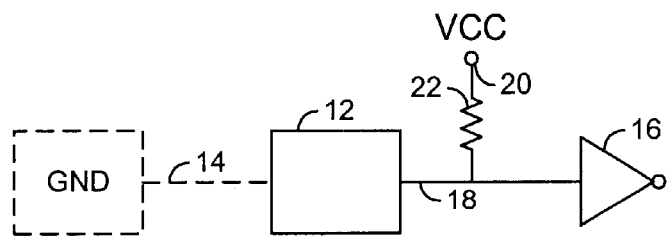
FIG. 1 is a partial schematic diagram of a portion of an integrated circuit chip illustrating bonding pads.
Figure 2:
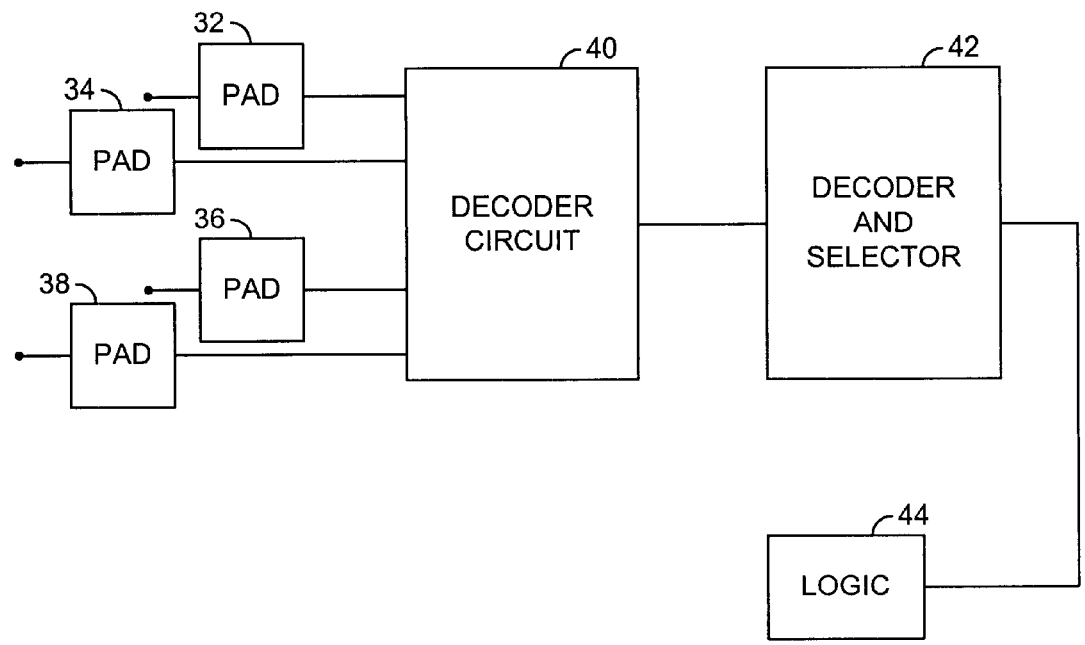
FIG. 2 is a block diagram of a portion of an integrated circuit chip illustrating bonding pads with the circuitry of the present invention.

Referring now to FIG. 2, a block diagram of the apparatus used in practicing the present invention is illustrated. Bond pads 32, 34, 36 and 38 are illustrated as connected to decoder circuit 40. Each of these bond pads is a connection point to outside the integrated circuit chip. This is the point where selection of the function of the chip is to be made.

Decoder circuit 40 receives information from bond pads 32, 34, 36 and 38 as inputs, decodes this information and feeds the decoded information to control signal decoder and selector 42 over sixteen hard wire connections. Decoder and selector 42 feeds this information to the logic circuits on the remainder of the integrated circuit chip. Decoder and selector 42 may have any number of a plurality of outputs to the remaining logic circuits in the remainder of the integrated circuit chip.

Bond pads 32, 34, 36 and 38 provide an output in the form of binary signals, that is, either a zero or a one. The output of the bond pad, or the input to decoder circuit 40, is a logic "0", zero, if the bond pad is bonded out. The output of the bond pad is a logic "1", one, if the bond pad is allowed to float high because of the pullup resistor. Although the opposite sense could easily be used.

There are four bond pad circuits, 32, 34, 36 and 38, illustrated in this example, however, there may be more or less bond pad circuits depending on the application. The outputs of bond pads 32, 34, 36 and 38 are connected to four to sixteen binary decoder circuit 40. Decoder circuit 40 has sixteen wire connections to decoder and selector 42, however, only one of the wires becomes active. Decoder circuit 40 decodes the "ones" and "zeros" received from the bond pads 32, 34, 36 and 38 input circuits to determine which one of the sixteen output wires is to become active. Decoder circuit 40 decodes which one of the sixteen potential options has been chosen by the bonding of the integrated circuit chip.

The integrated circuit of the present invention uses the sixteen possible bonding permutations to change the complete functionality of the device between sixteen different functions which include buffer, register, latches, complex buffer register, etc.

Because the sixteen different functions are themselves industry standards, when the chip changes function there is a requirement to change several other aspects of the chip.

First, the number of input and output ports or data paths must be changed. Second, the partitioning within the device in terms of groups of data paths must be changed. Third, whether the data path is uni-directional or bi-directional may have to be changed. Fourth, whether the data path is inverting or non-inverting may also have to be changed. Fifth, the function and number of control pins, e.g. output enables, clocks, etc. will have to be changed. Sixth, various data paths will change with respect to whether they are used or not used. Seventh, whether particular input pins have bus hold or not.

Decoder and selector circuit 42 receives the output from decoder circuit 40 and produces signals that instruct logic circuits 44 in the integrated circuit chip. As stated previously, decoder and selector circuit 42 may have any number of output wires. These wires are connected to logic circuits 44 in the remainder of the integrated circuit chip. The signals to logic circuits 44 cause the logic circuits to perform some function which depends upon which option has been chosen by the bonding of the integrated circuit chip. For example, one logic circuit in logic circuits 44 may cause an inverting or non-inverting path to be selected for a signal. These signals may also be used to select which bond pad is to be used as the source of a signal like the clock signal.

There are many uses of bond optioning. First, bond optioning may be used to change the format of a chip. In this respect bond optioning may be used to change an asynchronous SRAM into a registered synchronous version.

Second, bond optioning may be used to change the specification of a chip. Bond optioning may be used to change the output device current capability from, for example, 64/−32 mA to 24/−24 mA.

Third, bond optioning may be used to change an internal parameter of the chip. Changing the edge rate control resistor in the output buffer to a different value may be done by bond optioning. This is equivalent to replacing the memory cells in an EEPROM with bond optioning or to replacing laser trimming in an SRAM.

Fourth, bond optioning can be used to change the complete functionality of the device. In this manner it may be used to change the device from a buffer to a register.

The integrated circuit previously identified as the 7144 uses bond optioning. The 7144 is unique in the fact that it has four bond option pads. This means that there are sixteen different variations for the pads to be bonded or not bonded. The 7144 is the master chip for the 16 bit FCT logic family.

The decoding method of the present invention has been illustrated in a preferred embodiment having two levels, using a decoder and a control signal decoder and selector. This has been done for simplicity of design and understanding. It is to be understood that in most commercially available integrated circuit chips the four to sixteen decoder and the control signal decoder and selector may be accomplished in one stage or alternatively several successive stages.

The 7144 encompasses all the parts in the FCT dual octal family. There are 16 different logical functions, e.g., buffer, register and latches. All of these parts may or may not have bus hold on their inputs and I/Os. All of these parts can have 64/−32 mA drive or +24/−24 mA drive. A complete list of parts of the 7144 integrated circuit chip is shown in FIG. 3.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

What is claimed is:

1. An apparatus for controlling the functionality of an integrated circuit comprising:

a plurality of bond pads each configured to provide a signal; and a decoder having (i) a first number of inputs, each receiving one of said signals and (ii) a second number of outputs, wherein a state of each of said outputs depends on which of said bond pads is bonded out.

2. The circuit according to claim 1 wherein said circuit is on an integrated circuit chip configured to have a plurality of functions.

3. The apparatus according to claim 2 further comprising a control circuit producing control signals transmitted to different portions of the integrated circuit chip in response to said decoder outputs.

4. The apparatus according to claim 2 wherein said decoder includes a control signal means for producing control signals transmitted to different portions of the circuit in response to said signals at said decoder inputs.

5. The apparatus according to claim 1 wherein the plurality of bond pads comprises at least four bond pads.

6. An apparatus for controlling functionality in an integrated circuit by bond optioning including:

bond option means for providing a plurality of signals; and decoder means for receiving said signals and providing a number of outputs each having a state depending on which of said bond option means is bonded out.

7. The apparatus according to claim 1 wherein said decoder selects a path that correlates the functionality of the circuit to the signal(s) at the decoder inputs.

8. The apparatus according to claim 6 wherein said bonding pad means comprises at least four bonding pads.

9. An apparatus for controlling the functionality of an integrated circuit comprising:

a plurality of bond option pads each configured to provide a signal having a logic state that depends on whether the bond option pad is bonded out; and a decoder having (i) a first number of inputs, each receiving one of said signals and (ii) a second number of outputs, wherein a state of each of said outputs depends on which of said bond option pads is bonded out.

* * * * *